United States Patent
Gottlieb

(10) Patent No.: US 9,331,656 B1
(45) Date of Patent: May 3, 2016

(54) AUDIO SYSTEMS AND METHODS EMPLOYING AN ARRAY OF TRANSDUCERS OPTIMIZED FOR PARTICULAR SOUND FREQUENCIES

(76) Inventor: Steven M. Gottlieb, New York, NY (US)

( * ) Notice: Subject to any disclaimer, the term of this patent is extended or adjusted under 35 U.S.C. 154(b) by 862 days.

(21) Appl. No.: 13/163,171

(22) Filed: Jun. 17, 2011

Related U.S. Application Data

(60) Provisional application No. 61/355,984, filed on Jun. 17, 2010.

(51) Int. Cl.
*H03G 5/00* (2006.01)
*H04R 3/00* (2006.01)
*H03G 5/16* (2006.01)
*H04R 3/04* (2006.01)

(52) U.S. Cl.
CPC ............... *H03G 5/165* (2013.01); *H03G 5/005* (2013.01); *H04R 3/04* (2013.01)

(58) Field of Classification Search
CPC ................ G01N 2291/106; G01N 2291/0256; G01N 2291/0426; H04R 3/04; H04R 3/06; H04R 3/08; H04R 3/10; H04R 3/12; H04R 3/14; H03G 5/165; H03G 5/24
USPC ......... 381/17, 92, 18, 55, 58, 59, 96, 98, 101, 381/102, 103, 77–79, 111, 116, 117, 119
See application file for complete search history.

(56) References Cited

U.S. PATENT DOCUMENTS

| | | | | |
|---|---|---|---|---|
| 4,648,079 A | * | 3/1987 | Stedtnitz | 367/13 |
| 4,689,818 A | * | 8/1987 | Ammitzboll | 381/320 |
| 5,369,623 A | * | 11/1994 | Zerangue | 367/93 |
| 6,978,656 B2 | * | 12/2005 | Blakley | 73/24.06 |
| 7,117,743 B2 | * | 10/2006 | Blakley | 73/602 |

(Continued)

FOREIGN PATENT DOCUMENTS

WO   WO 2005086526 A1 *  9/2005  ............... H04R 3/12

OTHER PUBLICATIONS

Ayatollahi et al. "Design and Modeling of Micromachined Condenser MEMS Loudspeaker Using Permanent Magnet Neodymium-Iron-Boron (Md-Fe-B)." ICSE2006 Proc. 2006.

(Continued)

*Primary Examiner* — Xu Mei
(74) *Attorney, Agent, or Firm* — Robert W. Morris; Seth A. Newman; Eckert Seamans Cherin & Mellott, LLC

(57) ABSTRACT

Systems and methods for generating sound, detecting sound, and generating and detecting sound are provided. An array of audio transducers can be provided whereby each audio transducer in the array can be optimized for a narrow range of sound frequencies. When operating at or close to its resonant frequency, a transducer can generate (and/or detect) sound with a higher efficiency and less distortion as compared to other frequencies. Accordingly, sound may be divided into component signals such that each transducer is only responsible for generating (and/or detection) sound close to its resonant frequency. This sound reproduction (and/or detection) technique can increase efficiency, and therefore, can increase the total output volume that an array can generate using a given amount of input power when generating sound (and/or increase the total output power that an array can generate using a given amount of input volume when detecting sound).

47 Claims, 9 Drawing Sheets

(56) References Cited

U.S. PATENT DOCUMENTS

| | | | |
|---|---|---|---|
| 7,270,005 B2* | 9/2007 | Blakley | 73/602 |
| 7,319,641 B2* | 1/2008 | Goudie et al. | 367/138 |
| 7,515,719 B2* | 4/2009 | Hooley et al. | 381/18 |
| 7,577,260 B1* | 8/2009 | Hooley et al. | 381/77 |
| 7,606,380 B2* | 10/2009 | Melanson | 381/300 |
| 7,764,796 B2* | 7/2010 | Lechner | 381/59 |
| 7,965,850 B2* | 6/2011 | Higashihara | 381/59 |
| 8,027,488 B2* | 9/2011 | Pompei | 381/111 |
| 8,094,827 B2* | 1/2012 | Baba et al. | 381/63 |
| 8,126,161 B2* | 2/2012 | Togami et al. | 381/94.3 |
| 8,238,588 B2* | 8/2012 | Meyer et al. | 381/182 |
| 8,335,324 B2* | 12/2012 | Zhang et al. | 381/107 |
| 8,357,981 B2* | 1/2013 | Martin et al. | 257/415 |
| 8,477,951 B2* | 7/2013 | Jung et al. | 381/18 |
| 8,594,342 B2* | 11/2013 | Martin et al. | 381/96 |
| 8,670,571 B2* | 3/2014 | Clemow | 381/71.1 |
| 2003/0194103 A1* | 10/2003 | Kakinuma | 381/361 |
| 2004/0086140 A1* | 5/2004 | Fedigan et al. | 381/96 |
| 2004/0151325 A1* | 8/2004 | Hooley et al. | 381/18 |
| 2004/0153293 A1* | 8/2004 | Blakley | 702/191 |
| 2004/0264716 A1* | 12/2004 | Fidlin et al. | 381/161 |
| 2005/0008182 A1* | 1/2005 | Kakinuma | 381/358 |
| 2005/0022601 A1* | 2/2005 | Blakley | 73/612 |
| 2005/0031131 A1* | 2/2005 | Browning et al. | 381/59 |
| 2005/0031132 A1* | 2/2005 | Browning et al. | 381/59 |
| 2005/0031133 A1* | 2/2005 | Browning et al. | 381/59 |
| 2005/0031137 A1* | 2/2005 | Browning et al. | 381/96 |
| 2005/0031138 A1* | 2/2005 | Browning et al. | 381/96 |
| 2005/0031139 A1* | 2/2005 | Browning et al. | 381/96 |
| 2005/0031140 A1* | 2/2005 | Browning | 381/96 |
| 2005/0092088 A1* | 5/2005 | Blakley | 73/582 |
| 2005/0132812 A1* | 6/2005 | Blakley | 73/628 |
| 2005/0220313 A1* | 10/2005 | Tohyama et al. | 381/98 |
| 2005/0248233 A1* | 11/2005 | Pompei | 310/322 |
| 2006/0104451 A1* | 5/2006 | Browning et al. | 381/59 |
| 2006/0153403 A1* | 7/2006 | Lechner | 381/102 |
| 2007/0253583 A1* | 11/2007 | Melanson | 381/303 |
| 2007/0263894 A1* | 11/2007 | Stiles | 381/335 |
| 2007/0286427 A1* | 12/2007 | Jung et al. | 381/17 |
| 2008/0019535 A1* | 1/2008 | Mitsuhashi et al. | 381/66 |
| 2008/0089522 A1* | 4/2008 | Baba et al. | 381/17 |
| 2008/0107281 A1* | 5/2008 | Togami et al. | 381/66 |
| 2008/0152186 A1* | 6/2008 | Crowley | 381/399 |
| 2009/0003634 A1* | 1/2009 | Kushida | 381/300 |
| 2009/0161880 A1* | 6/2009 | Hooley et al. | 381/17 |
| 2009/0238383 A1* | 9/2009 | Meyer et al. | 381/182 |
| 2009/0296954 A1* | 12/2009 | Hooley et al. | 381/80 |
| 2010/0158275 A1* | 6/2010 | Zhang et al. | 381/107 |
| 2010/0232623 A1* | 9/2010 | Martin et al. | 381/96 |
| 2010/0249570 A1* | 9/2010 | Carson et al. | 600/407 |
| 2010/0266153 A1* | 10/2010 | Gobeli et al. | 381/321 |
| 2010/0322432 A1* | 12/2010 | Clemow | 381/71.1 |
| 2012/0091544 A1* | 4/2012 | Reichenbach et al. | 257/416 |
| 2012/0099740 A1* | 4/2012 | Ma et al. | 381/94.4 |

OTHER PUBLICATIONS

Cheng et al. "A Silicon Microspeaker for Hearing Instruments." Journal of Micromechanics and Microengineering 14, 2004, pp. 859-866.

Diamond et al. "Digital Sound Reconstruction Using Arrays of CMOS-MEMS Microspeakers." Transducers '03, the 12th International Conference on Solid State Sensors, Actuators and Microsystems, Jun. 8-12, 2003, pp. 238-241.

Harradine et al. "A Micro-Machined Loudspeaker for the Hearing Impaired." Transducers '97, 1997 International Conference on Solid-State Sensors and Actuators, Jun. 16-19, 1997, pp. 429-432.

Neumann, Jr. et al. "CMOS-MEMS Membrane for Audio-Frequency Acoustic Actuation." Micro Electro Mechanical Systems, 2001. MEMS 2001. The 14th IEEE International Conference, Jan. 21-25, 2001, pp. 236-239.

Zeleznik, "Characterization of CMOS MEMS Membranes for Audio Acoustics." Masters Thesis, Carnegie Mellon University, 2003.

\* cited by examiner

AUDIO SYSTEMS AND METHODS EMPLOYING AN ARRAY OF TRANSDUCERS OPTIMIZED FOR PARTICULAR SOUND FREQUENCIES

CROSS-REFERENCE TO RELATED APPLICATION

This application claims the benefit of U.S. Provisional Application No. 61/355,984, filed Jun. 17, 2010, the disclosure of which is incorporated by reference herein in its entirety.

FIELD OF THE DISCLOSURE

This can relate to systems and methods for generating sound, systems and methods for detecting sound, and systems and methods for generating and detecting sound.

BACKGROUND OF THE INVENTION

Traditional audio systems provide flawed audio through inefficient techniques. For example, many traditional speakers contain only two or three components (e.g., a subwoofer, a mid-range and a tweeter), and each of the components is intended to cover a broad range of frequencies. However, due to the physical limitations of these components, it is incredibly difficult and expensive to produce components that accurately generate sound over such a broad range of frequencies. Moreover, such components typically operate in an inefficient manner that requires relatively large amounts of power. These same limiting principles can also affect the performance of traditional microphones. Accordingly, improved audio systems are needed that can accurately generate and/or detect sounds in an efficient manner.

SUMMARY OF THE INVENTION

Systems and methods for accurately and efficiently generating audio are provided. An array of audio transducers can be provided whereby one or more audio transducers in the array can be optimized for a narrow range of sound frequencies. When operating at or close to its resonant frequency, a transducer can generate sound with a higher efficiency and less distortion as compared to other frequencies. Accordingly, sound may be divided into component signals such that each transducer is only responsible for producing sound close to its resonant frequency. This sound reproduction technique can increase efficiency, and therefore, can increase the total output volume that an array can generate using a given amount of input power when producing sound. Moreover, the sound reproduction technique described herein can reduce overall distortion (e.g., distortion across the frequency spectrum) of the sound generated by the array when producing sound.

In some embodiments, an audio stream may be analyzed and then one or more transducers in an array of transducers may be adjusted to optimize the array for that audio stream. For example, the frequency composition of the audio stream may be determined to identify prominent frequency bands and then the resonant frequencies of one or more transducers in the array may be adjusted to provide better audio quality in those bands.

In some embodiments, the same principles used to provide audio with minimal distortion can be applied to detecting audio with minimal distortion. For example, one or more transducers in an array can be adjusted to provide high quality audio detection in prominent frequency bands for recording purposes.

In some embodiments, the same array of transducers can be used to both generate and detect sound. In other embodiments, dedicated arrays of transducers may be designed specifically for generating or detecting sound.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

In accordance with the disclosure, an array of audio transducers can be provided and each audio transducer in the array can be optimized for a narrow range of sound frequencies. For example, each transducer in the array can have one or more physical characteristics that renders it ideal for producing (and/or detecting) sound within a narrow range of frequency (e.g., an optimum frequency or a resonant frequency). When operating at or close to its optimum frequency, the transducer can generate (and/or detect) sound with a higher efficiency and less distortion as compared to other frequencies. In some embodiments, the transducer may efficiently generate (and/or detect) sound at or close to its optimum frequency because the transducer's mechanical structure will naturally encourage vibrations at that frequency. In some embodiments, the transducer may generate (and/or detect) sound at or close to its optimum frequency with minimal distortion because the acoustic volume behind the transducer may be optimized so that any reflections off the back surface do not destructively interfere with the output sound.

Figure 1:
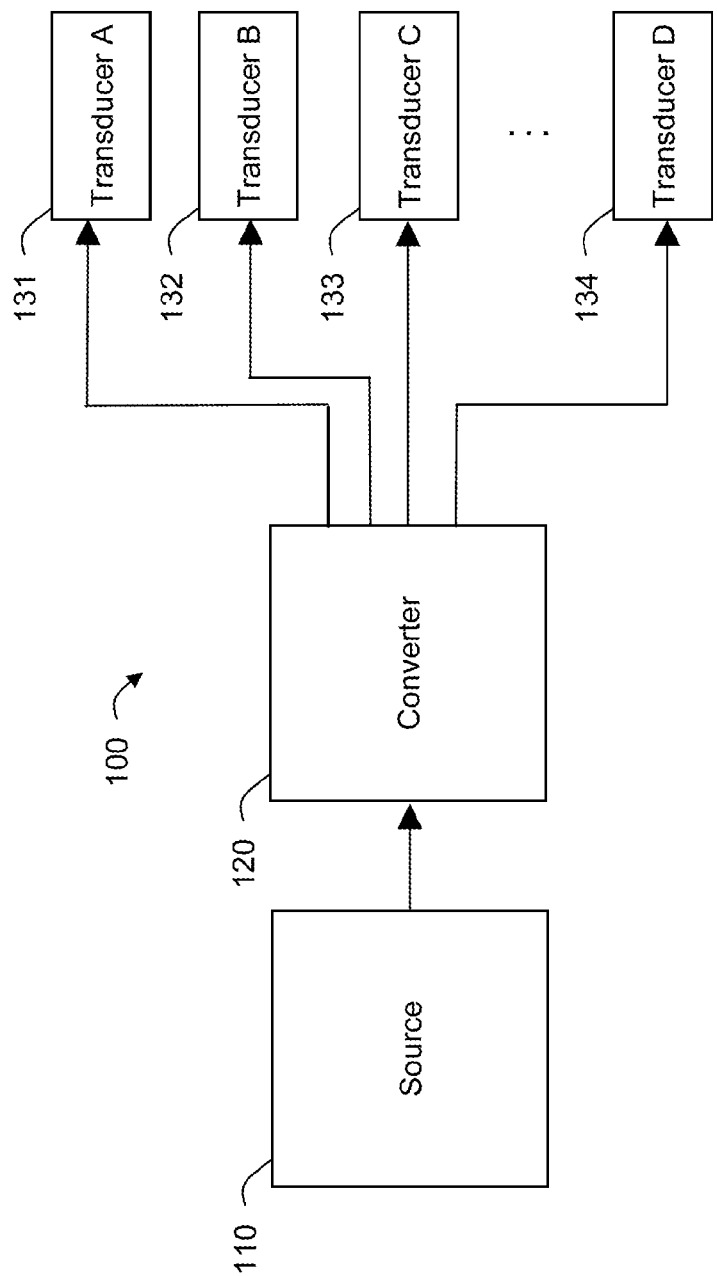
FIG. 1 is a schematic view of an illustrative audio system incorporating an array of transducers in accordance with some embodiments of the invention.

FIG. 1 includes audio system 100 incorporating an array of transducers in accordance with some embodiments. System 100 can include source 110, converter 120, and transducers 131-134. Source 110 can be any source of audio signals or data. In some embodiments, source 110 can be a source of analog audio signals. For example, source 110 can be a media player or communications device that provides analog audio signals as output. In some embodiments, source 110 can be a source of digital audio data. For example, source 110 can be storage or memory on which data is stored as a digital file.

Transducers 131-134 can each be any suitable audio transducer for generating sound. For example, one or more of transducers 131-134 may be operable to generate sound waves in response to electrical signals (e.g., a speaker driver). Each of transducers 131-134 may be designed to generate a different narrow range of sound frequencies in an efficient and distortion-free manner. In some embodiments, one or more of transducers 131-134 may include conductive material coupled with or integrated into a diaphragm. Continuing the example, electric signals may be passed through the conductive material to control the diaphragm and thereby generate audio waves through electromagnetic induction.

In some embodiments, each of transducers 131-134 can be optimized for a different range of sound frequencies. For example, Transducer A 131 may be designed to generate sound at the highest range of frequencies that system 100 can handle, Transducer B 132 may be designed to generate sound at the next lowest range of frequencies and so forth. In this manner, the array of transducers 131-134 may be designed to collectively cover the audible spectrum. In some embodiments, each of transducers 131-134 may be designed so that the transducer's resonant frequency is located squarely in the middle of its respective range of frequencies. If each of transducers 131-134 are designed in this manner and the frequency ranges are sufficiently narrow, each transducer may only be responsible for generating audio within a narrow range around its resonant frequency. Limiting the range of operation to a narrow range enables each transducer to operate with the least amount of distortion and power loss.

It is understood that any number of transducers can be used in accordance with the disclosure. However, in accordance with some embodiments of the invention, it may be advantageous to employ a large number of transducers so that the range of frequencies which each transducer has to generate is relatively narrow. Accordingly, the more transducers that are provided in the array, the higher the quality of audio that is produced and at an expense of less power loss.

Therefore, a system may include a relatively large number of transducers. For example, a system may include 20 or more audio transducers; 50 or more audio transducers; 100 or more audio transducers; 200 or more audio transducers; 500 or more audio transducers; 1,000 or more audio transducers; 5,000 or more audio transducers; 10,000 or more audio transducers; 50,000 or more audio transducers or 100,000 or more audio transducers.

In some embodiments, the number of transducers in a system may vary over time. For example, a system may be configurable so that a user can add or remove transducers from the system. In some embodiments, transducers may be grouped in physical units with separate housings or substrates so that entire groups of transducers can be added or removed from the system. In another example, a system may test transducers and may disconnect (e.g., effectively remove) non-working or damaged transducers from the system while still maintaining the production (and/or detection) of quality audio.

Converter 120 may be electrically coupled to both source 110 and transducers 131-134. In some embodiments, converter 120 may be electrically coupled with source 110 and/or transducers 131-134 through one or more conductors (e.g., traces, wires or cables). In some embodiments, converter 120 may be coupled with source 110 and/or one or more of transducers 131-134 through a wireless communications interface. Converter 120 can include any suitable circuitry for processing audio, including one or more processors, one or more digital signal processors, one or more amplifiers, one or more crossovers, one or more filters, any other suitable circuitry, or any suitable combination thereof. Converter 120 can receive audio streams from source 110 (e.g., through analog signals or digital data), convert the audio streams, and then transmit control signals to transducers 131-134. Converter 120 may divide audio streams received from source 110 into different component signals corresponding to different frequency ranges. For example, each component signal may have a frequency range that is centered on a resonant frequency of a respective one of transducers 131-134. Component signals can be transmitted, in a synchronized manner, to transducers 131-134 for collectively producing sound based on the entire audio stream. By sending each transducer a component signal with frequencies predominantly or solely at or near the resonant frequency of the transducer, the transducer can efficiently produce that portion of the sound with minimal distortion. The combined sound produced by all of transducers 131-134 may therefore be of a high quality.

If source 110 provides an audio stream that includes an analog audio signal, converter 120 may divide the analog signal into component analog signals, and transmit each of the component signals to a respective one of transducers 131-134 for sound generation. If source 110 provides an audio stream that includes digital audio data, converter 120 may, in some embodiments, convert the digital audio data into an analog signal and then process the analog signal as discussed above. In other embodiments, converter 120 may divide the digital audio data into component data streams corresponding to different frequencies or frequency ranges, and transmit each of the component data streams to a respective one of transducers 131-134 for conversion to analog and sound generation.

In some embodiments, the operation of a converter (e.g., converter 120) may be based at least partially on the transducers coupled with the converter. For example, converter 120 may divide an audio stream into as many component signals as there are transducers, and therefore resonant frequencies, in an array. In some embodiments, the frequency range of each component signal may be based at least partially on the resonant frequency of a respective transducer in the system. For example, the frequency range of a component signal may be a narrow frequency range centered over the resonant frequency of a corresponding transducer. In some embodiments, the size of the frequency ranges of each component signal may be based at least partially on how many transducers are in an array or the space between the resonant frequencies. In situations where there are many transducers and a large number of resonant frequencies, the frequency ranges of each component signal may be even narrower.

It is understood that transducers of any type can be employed in accordance with this disclosure. For example, an array of piezoelectric transducers, magnetostrictive transducers, electrostatic transducers, ribbon magnetic transducers, planar magnetic transducers, bending wave transducers, flat panel transducers, distributed mode transducers, heil air motion transducers, plasma arc transducers or any combination thereof can be used. In some embodiments, smaller transducers may be advantageous because they may minimize space constraints on the number of transducers. For example, micrometer-scaled transducers can be manufactured through techniques in accordance with microelectromechanical systems (MEMS) and employed in accordance with this disclosure.

Figure 2A:
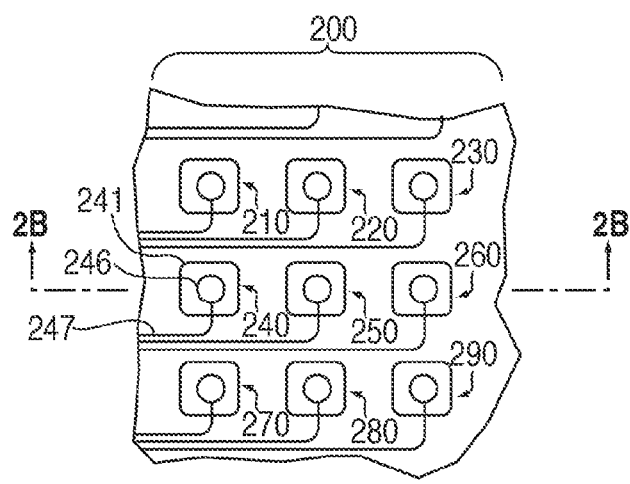
FIGS. 2A and 2B are schematic views of an illustrative array of transducers in accordance with some embodiments of the invention.

FIG. 2A includes array 200 of transducers in accordance with some embodiments. Array 200 can include audio transducers 210, 220, 230, 240, 250, 260, 270, 280, and 290 (see, e.g., transducers 131-134 of system 100). Each of the transducers in array 200 may be of a micrometer scale and manufactured using MEMS techniques. Each transducer may include a diaphragm, a conductive member, and one or more control lines coupled to the conductive member. For example, transducer 240 can include diaphragm 241, conductive path 246, and control line 247 coupled with conductive path 246. A diaphragm may be a flexible membrane formed from any suitable material. For example, diaphragm 241 may be a polymer membrane. Coupled with or integrated into its diaphragm, each audio transducer may include a conductive path. For example, transducer 240 may include path 246 formed from a conductive material. In some embodiments, path 246 may be formed by depositing a conductive metal onto the surface of a diaphragm.

Each audio transducer may also include a control line electrically coupled with the conductive path. For example, audio transducer 240 may include control line 247 for transmitting electrical signals to and from path 246. A control line can include one or more conductors. In some embodiments, a control line may include an active conductor and a return conductor. In some embodiments, a control line may include only an active conductor and two or more transducers in an array may employ a common return conductor. A control line may be formed from any conductive material, including, for example, a conductive trace or wire. In accordance with the disclosure, it is understood that a control line may also be used as an incoming signal line when detecting sounds.

Figure 2B:
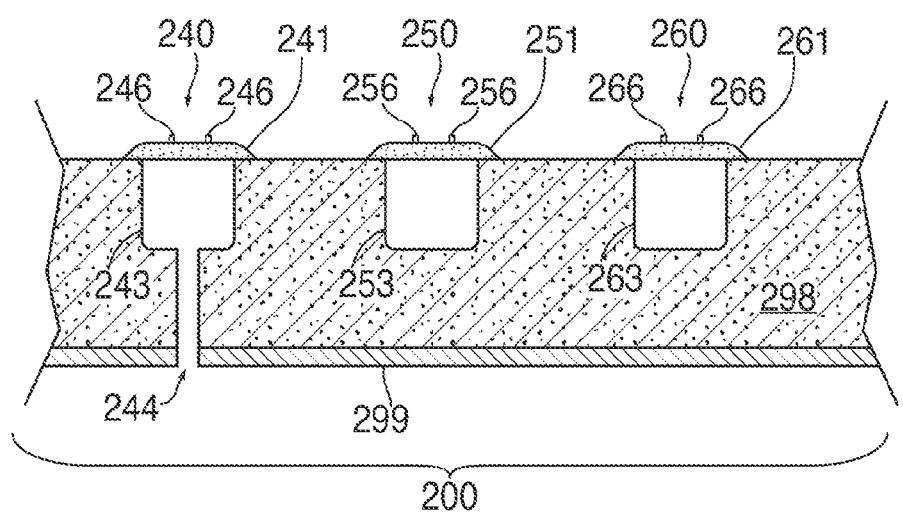

In some embodiments, as shown in FIG. 2B, each transducer may include a cavity located beneath the diaphragm. For example, transducer 240 may include cavity 243, transducer 250 may include cavity 253, and transducer 260 may include cavity 263. Such cavities may be formed by micromachining or etching away a substrate in which one or more transducers is located. For example, transducers 240, 250, and 260 may be located on substrate 298 and cavities 243, 253, and 263 may be formed by etching away portions of substrate 298. In some embodiments, one or more audio transducers may be located on a silicon substrate and known techniques for integrated circuit manufacturing can be used for etching and/or depositing conductive materials.

In some embodiments, a magnetic or electrically charged component may be provided adjacent to one or more of the audio transducers. Such magnetic or electrically charged component may provide a magnetic field for the purposes of generating (and/or recording) sound using a flexible diaphragm and electromagnetic induction. For example, electrically conductive plating 299 may be provided on the opposite side of substrate 298 from transducers 240, 250, and 260. Continuing the example, plating 299 may be electrically charged so that, when a potential is applied to conductive paths 246, 256, or 266, a respective one of diaphragms 241, 251, and 261 can be displaced by electromagnetic induction and generate a sound wave. As another example, plating 299 may be electrically charged so that, when a sound wave displaces diaphragms 241, 251, and 261 the current flowing through conductive paths 246, 256, or 266 may be altered to generate an electric signal through electromagnetic induction.

The resonant frequency of each transducer in an array may be a function of any suitable characteristic or combination of characteristics of the transducer. In some embodiments, the resonant frequency of one or more transducers in an array may be a function of the rigidity or flexibility of the material from which its diaphragm is formed. For example, more flexible materials may lead to higher resonant frequencies because the diaphragm may move more easily, while less flexible materials may lead to lower resonant frequencies because the diaphragm may not be displaced as easily. In some embodiments, the resonant frequency of one or more transducers in an array may be a function of the transducer's cavity (e.g., the volume, depth, or shape of the cavity). For example, larger cavities may lead to lower resonant frequencies because a larger amount of air in a transducer's cavity may allow the transducer's diaphragm to travel a greater distance while a smaller amount of air may be less compressible and, therefore, not allow the transducer's diaphragm to travel as great of a distance. In some embodiments, the resonant frequency of one or more transducers in an array may be a function of whether or not its cavity includes an acoustic port, the number of acoustic ports in its cavity, the size of any acoustic ports in its cavity, or any combination thereof. For example, cavity 243 may include acoustic port 244 and the port may have an effect on the resonant frequency of transducer 240. In some embodiments, the installation of one or more ports may lead to lower resonant frequencies because a port can allow for free movement of air into the transducer's cavity and, therefore, greater deflection of the transducer's diaphragm. Like cavities themselves, ports can be formed by etching away a substrate or using any other suitable technique.

While the discussion of array 200 relates to MEMS audio transducers, it is understood that audio transducers of other sizes and types, such as those previously discussed, can be used in accordance with this disclosure.

Figure 3:
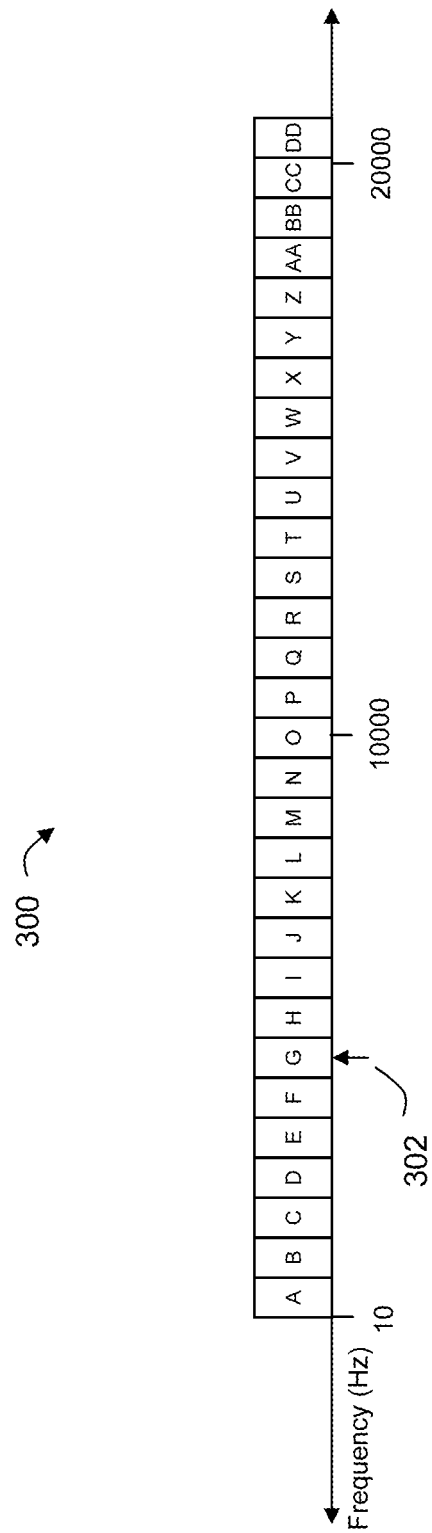
FIG. 3 is a schematic view of illustrative frequency ranges in accordance with some embodiments of the invention.

FIG. 3 includes chart 300 of illustrative frequency ranges in accordance with some embodiments. Chart 300 includes a scale of frequencies and numerous frequency ranges on the scale. In this illustrative embodiment, the frequency ranges are labeled from A to DD. Frequency ranges may be used to determine how an audio stream is divided into component signals for distribution amongst an array of transducers (see, e.g., system 100). For example, marker 302 can correspond to a resonant frequency of a particular transducer (e.g., one of transducers 131-134) and Range G may be centered over that resonant frequency. Accordingly, if a component signal that predominantly has frequencies within Range G is transmitted to the corresponding transducer, the transducer may efficiently produce sound with minimal distortion.

While chart 300 includes 30 frequency ranges for use with an array of audio transducers, it is understood that any number of frequency ranges and corresponding audio transducers can be used in accordance with the disclosure. For example, 20 or more; 50 or more; 100 or more; 200 or more; 500 or more; 1,000 or more; 5,000 or more; 10,000 or more; 50,000 or more; 100,000 or more; or any other suitable number of frequency ranges and corresponding audio transducers can be used without deviating from the spirit and scope of the disclosure. In some embodiments, more frequency ranges and audio transducers may lead to narrower frequency ranges and, therefore, greater efficiency and higher quality because each transducer will only be required to generate (and/or detect) audio near its resonant frequency.

Figure 4:
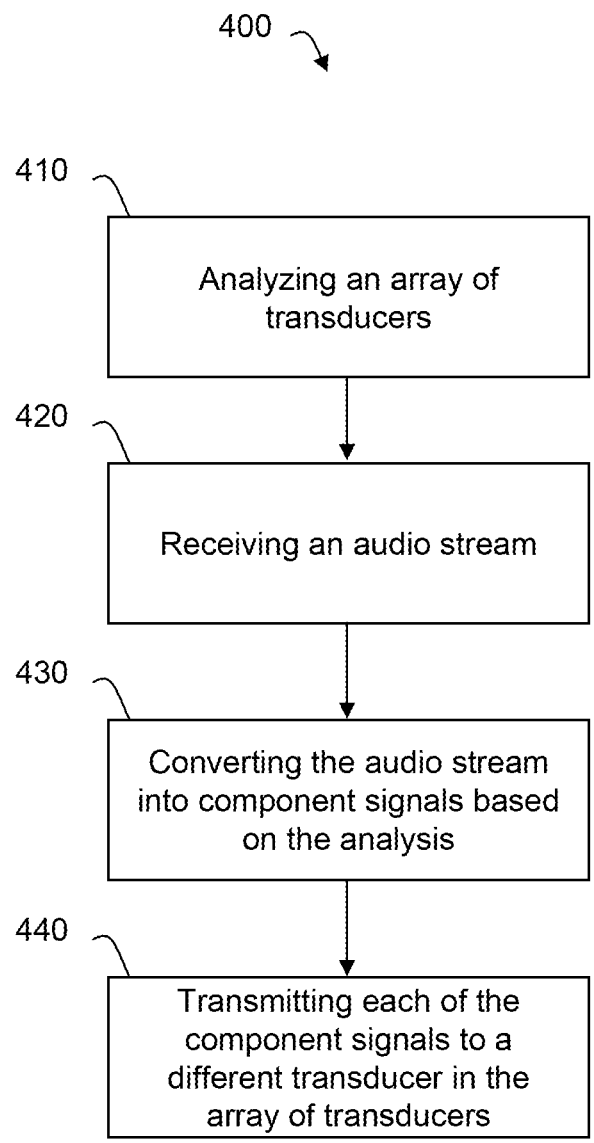
FIG. 4 is a flowchart of an illustrative process for employing an array of audio transducers in accordance with some embodiments of the invention.

FIG. 4 includes process 400 for employing an array of audio transducers in accordance with some embodiments of the invention. For example, process 400 can be used to efficiently generate high quality audio with an array of audio transducers. Process 400 can be performed by an audio system that includes an array of transducers (e.g., system 100). At block 410, an array of transducers can be analyzed. An array of transducers can be analyzed by passively or actively measuring one or more electrical characteristic of the transducer leads (e.g., resistance, impedance, voltage, current, inductance, capacitance, frequency response or any combination thereof).

Block 410 can include analyzing an array of transducers to determine any suitable characteristic of the array. For example, an array of transducers can be analyzed to determine the number of transducers in the array, the resonant frequencies of the transducers in the array, the relative locations of the transducers in the array, the maximum volume output of the transducers in the array, the condition of the transducers in the array (e.g., whether any transducers have incurred mechanical or thermal damage), any other suitable characteristic of the array, or any combination thereof. At block 420, an audio stream can be received. For example, an audio stream may be received from a source (see, e.g., source 110 shown in FIG. 1). An audio stream may be received from a component within an audio system (e.g., source 110 within system 100) or from an external source (e.g., a portable media player or an internet server). An audio stream received at block 420 can include one or more analog signals, one or more digital signals, or any combination thereof.

At block 430, the audio stream can be converted into component signals based on the analysis performed at block 410. Any characteristic of the transducer array determined at block 410 may be used to control the conversion of the audio stream at block 430. For example, the conversion of the audio stream may be based on the number of audio transducers or the resonant frequencies of the audio transducers.

In some embodiments, the number of component signals created at block 430 may depend on the analysis performed at block 410. For example, if the analysis performed at block 410 indicates that an array includes a certain number of transducers, the audio stream may be converted into a corresponding number of component signals.

In some embodiments, one or more characteristics of the component signals created at block 430 may be based on one or more characteristics of the transducer array. For example, a component signal may correspond to a particular transducer in the array and the range of frequencies included in the component signal may be centered over the resonant frequency of the particular transducer. Accordingly, the particular transducer can accurately and efficiently generate sound based on the corresponding component signal. In some embodiments, each component signal generated at block 430 may correspond to a respective transducer, and the frequency range of each component signal may match the resonant frequency of the corresponding transducer. If there are a substantial number of transducers in the array, each component signal may be narrowly tailored to the resonant frequency of a corresponding transducer and the accuracy and efficiency of the system can be drastically improved.

In some embodiments, a process may operate an array of transducers in a manner that decreases the chances of or completely prevents the transducers from "blowing out" (e.g., incurring mechanical or thermal damage). For example, converting an audio stream into component signals narrowly optimized for each transducer may decrease the chances that each transducer incurs mechanical or thermal damage. In some embodiments, a process may include analyzing one or more component signals to ensure that each component signal will not damage the corresponding transducer. For example, the converting performed at block 430 may include analyzing the component signals to ensure that the signals will not damage any of the transducers in the array (e.g., analyzing the magnitude and/or frequencies of the component signals).

At block 440, each of the component signals can be transmitted to a different transducer in the array of transducers. Each component signal may be transmitted to a respective transducer so that the frequency range of the component signal corresponds to the resonant frequency of the transducer (e.g., is approximately centered over the resonant frequency of the transducer). For example, each component signal may be transmitted to a corresponding transducer in the array, and the transducer can accurately and efficiently generate sound based on the component signal.

In some embodiments, a process may operate an array of transducers to compensate if one or more of the transducers is faulty or has incurred mechanical or thermal damage. If one or more faulty or damaged transducers are identified, those transducers may be effectively removed from service and component signals may no longer be transmitted to the faulty or damaged transducers. Moreover, unlike a traditional speaker that can be totally impaired if it is damaged, other transducers in the array may still be able to generate distortion-free audio even if some of the transducers are damaged. For example, block 410 may include determining whether any of the transducers in the array are damaged, block 430 may include converting the audio stream into component signals that only correspond to undamaged transducers and block 440 may include transmitting component signals to only the undamaged transducers.

In some embodiments, a system can include an array of dynamic transducers that can be adjusted to provide increased accuracy and efficiency. For example, the system may analyze an audio stream and then dynamically adjust one or more transducers in the array based on the analysis of the stream. Continuing the example, component signals may be created and transmitted to the array after adjustment for accurate and efficient sound generation.

Figure 5:
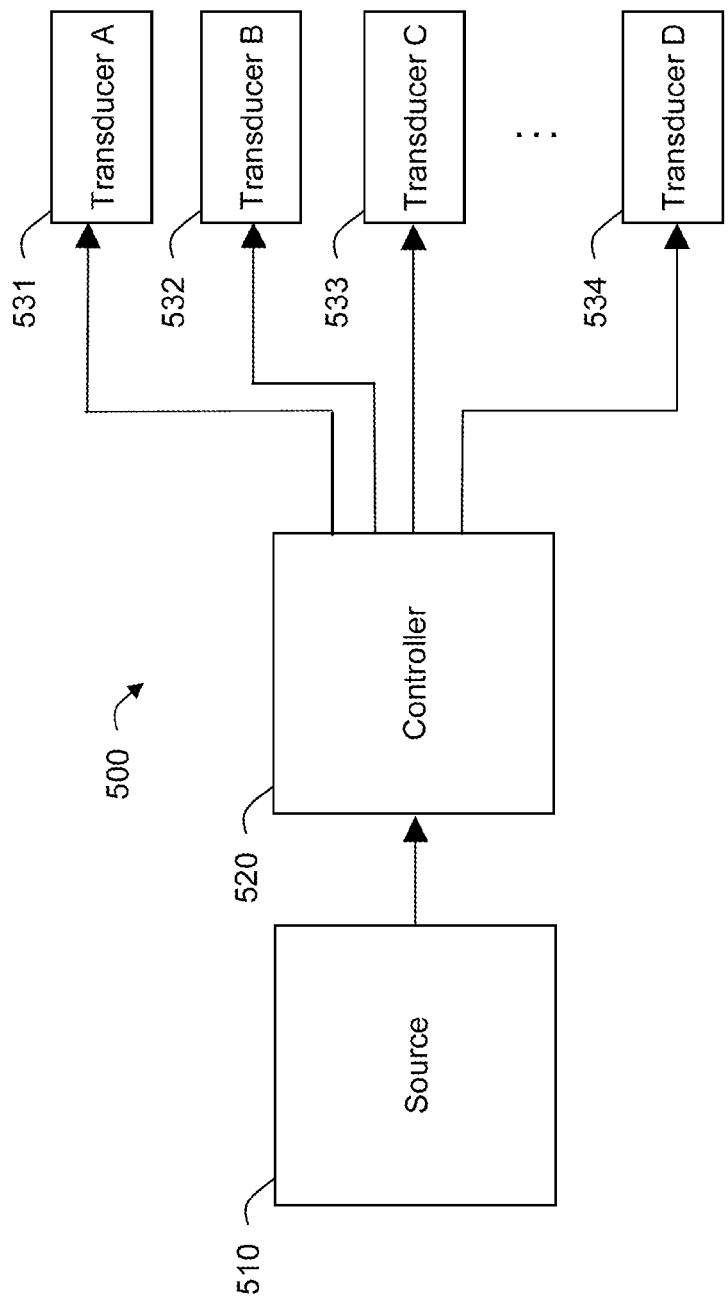
FIG. 5 is a schematic view of an illustrative audio system incorporating an array of transducers in accordance with some embodiments of the invention.

FIG. 5 includes audio system 500 incorporating an array of transducers in accordance with some embodiments. System 500 can include source 510, controller 520, and transducers 531-534. Source 510 can be any suitable source of audio streams. For example, source 510 can be substantially similar to source 110, as described above in connection with FIG. 1, and the previous description of the latter can be applied to the former.

Transducers 531-534 can each be a dynamic audio transducer for generating sound. Like transducers 131-134, each of transducers 531-534 can be used to generate sound based on an electrical signal. However, transducers 531-534 differ from transducers 131-134 in that transducers 531-534 may be dynamically configurable to change the resonant frequency of one or more transducers. For example, each of transducers 531-534 may be formed from a material that can be electrically adjusted to change the resonant frequency of the transducer. In some embodiments, transducers 531-534 may each include a material that changes one or more physical properties, such as rigidity, when an electrical potential or current is applied to the material. For example, transducers 531-534 may each include a diaphragm that is formed from a material that changes rigidity when an electrical potential is applied to the material. Continuing the example, a change in the rigidity of a transducer's diaphragm can result in a change of the resonant frequency of the transducer and, therefore, the resonant frequencies of transducers 531-534 may be adjustable. In this manner, transducers 531-534 may be dynamically adjusted based on an audio stream. For example, a system may analyze an audio stream to determine the frequency composition of the stream, adjust one or more transistors based on the analysis, and then create corresponding composition signals based on the adjustment.

While the embodiments shown in FIGS. 1 and 5 show separate systems that include static and dynamic transducers, it is understood that a system may include a combination of static transducers and dynamic transducers without deviating from the scope of the disclosure. For example, a system may include an array of static transducers covering the standard range of frequencies for audio streams, and the system may also include a number of dynamic transducers for use as supplemental transducers. In some embodiments, the dynamic transducers can be used as spares if one or more of the static transducers is faulty or becomes damaged. In some embodiments, the dynamic transducers can be used to augment static transducers for frequency ranges that are especially prominent in an audio stream.

Controller 520 may be electrically coupled to both source 510 and transducers 531-534. Controller 520 can include any suitable circuitry for processing audio and adjusting one or more of transducers 531-534, including one or more processors, one or more digital signal processors, one or more amplifiers, one or more crossovers, one or more filters, any other suitable circuitry, or any suitable combination thereof. Like converter 120 (shown in FIG. 1), controller 520 may receive an audio stream from source 510 and provide component signals to transducers 531-534. However, controller 520 may include circuitry for analyzing the audio stream and dynamically adjusting transducers 531-534 based on the analysis. For example, controller 520 may analyze the audio stream in real time as it is received. Continuing the example, controller 520 may then adjust the resonant frequencies of transducers 531-534 so that the array of transducers is configured to focus on the prominent frequencies or frequency ranges in the given audio stream.

In some embodiments, controller 520 may be coupled to each of the transducers through multiple electrical paths (see, e.g., control line 247 shown in FIG. 2A). For example, controller 520 may coupled to each transducer in the array through one or more electrical paths for transmitting component signals as well as one or more electrical paths for controlling transducer adjustments. In some embodiments, controller 520 may be coupled to each of the transducers through one or more electrical paths can both transmit component signals and control transducer adjustments. For example, electrical signals of a certain magnitude or frequency can be used to control transducer adjustments while other electrical signals can transmit component signals.

Figure 6:
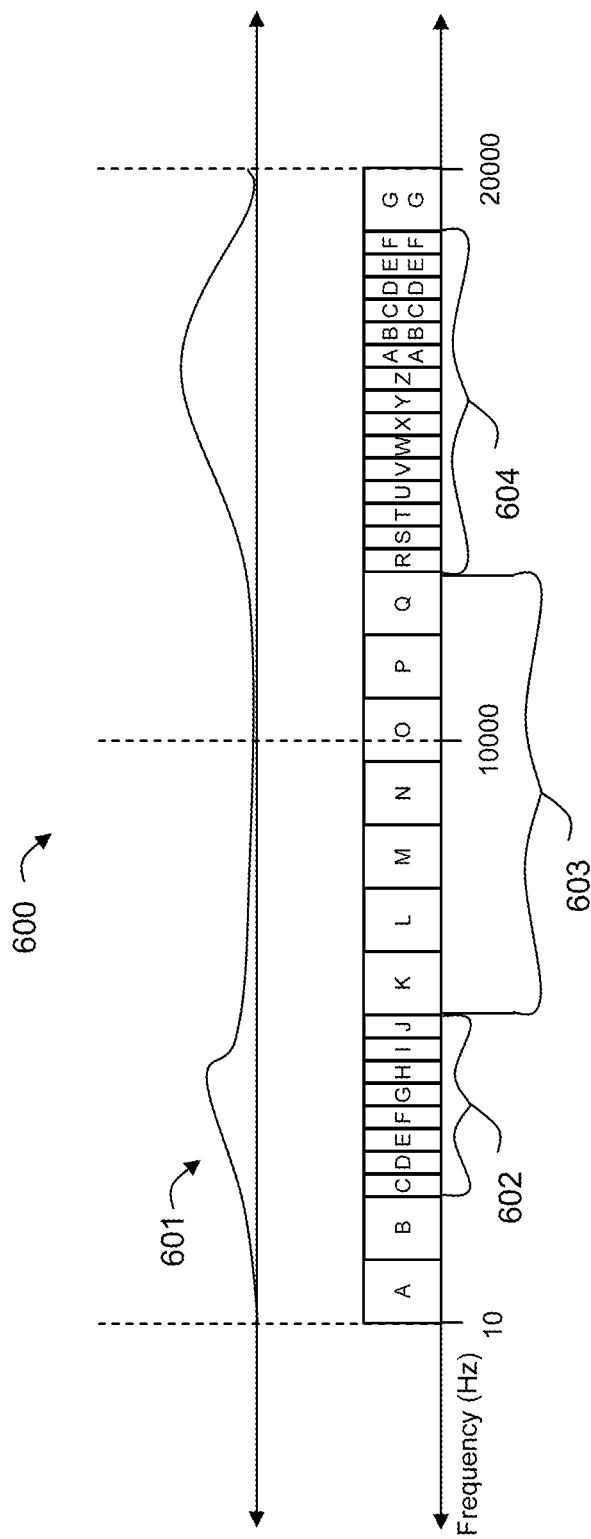
FIG. 6 is a schematic view of illustrative frequency ranges in accordance with some embodiments of the invention.

FIG. 6 includes chart 600 of illustrative frequency ranges in accordance with some embodiments. Chart 600 includes an audio stream's frequency composition 601 and various frequency ranges (see, e.g., groups 602-604) that are based on the audio stream's frequency composition. As seen in composition 601, the audio stream is predominantly composed of frequencies within two bands. In order to provide accurate and efficient sound, an audio system can provide a higher resolution of frequency ranges in these two bands. For example, frequency ranges in groups 602 and 604, which are labeled C to J and R to FF and correspond to the two bands featured in composition 601, may be narrower than the frequency ranges in group 603, which are labeled K to Q. Continuing the example, an array of transducers (see, e.g., transducers 531-534 shown in FIG. 5) may be adjusted so that the transducers' resonant frequencies correspond to the frequency ranges shown in FIG. 6. Accordingly, the system can generate sound in at least the prominent frequency bands with high accuracy and efficient power use. In accordance with the disclosure, the sound generated for the less important frequency bands may have less accuracy or efficiency but this may not be noticeable to an average listener (e.g., because those frequency bands carry less audio content).

While chart 600 includes 33 frequency ranges for use with an array of audio transducers, it is understood that any number of frequency ranges and corresponding audio transducers can be used in accordance with the disclosure. Moreover, any suitable technique can be used to configure frequency ranges based on the analysis of an audio stream. In some embodiments, rather than narrowing the frequency ranges in groups 602 and 604, a system may leave the ranges at a standard width but simply assign multiple transducers to each range so that the range can be generated at a higher volume. In some embodiments, a system may take transducers corresponding to less important frequency ranges (e.g., ranges in group 603) and reassign the transducers to the more prominent frequency ranges (e.g., ranges in groups 602 or 604).

Figure 7:
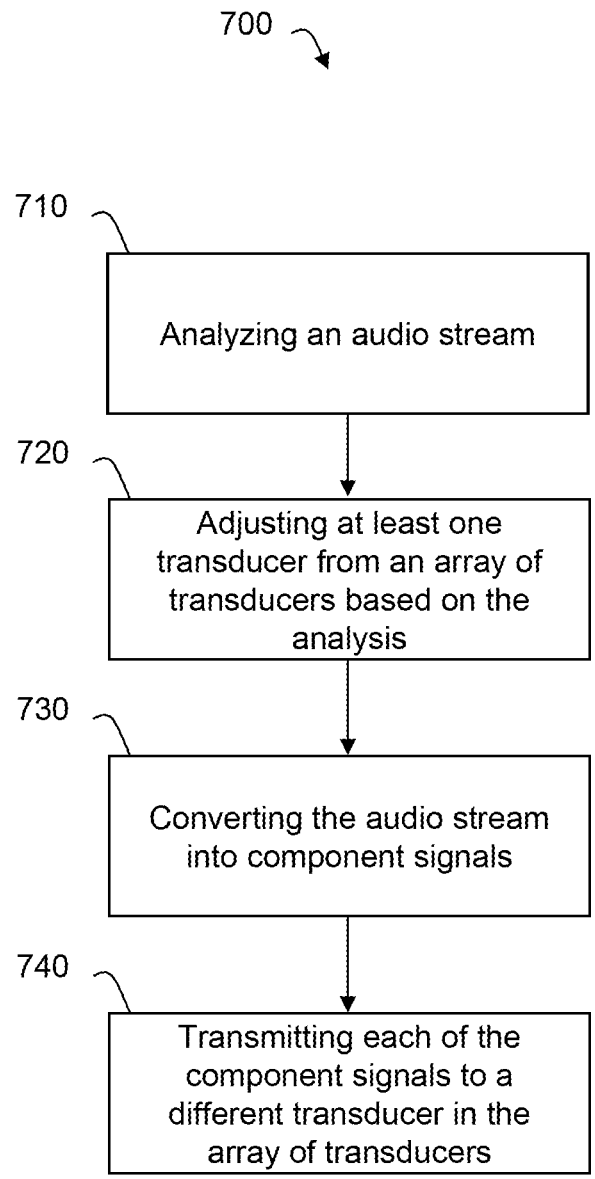
FIG. 7 is a flowchart of an illustrative process for employing an array of audio transducers in accordance with some embodiments of the invention.

FIG. 7 includes process 700 for employing an array of audio transducers in accordance with some embodiments of the invention. Process 700 may be employed in conjunction with an array of dynamic transducers that can be adjusted to accurately and efficiently generate sound (see, e.g., transducers 531-534 shown in FIG. 5). For example, process 700 can be used to dynamically adjust an array of audio transducers and efficiently generate high quality audio with the array. Process 700 can be performed by an audio system that includes an array of transducers (e.g., system 500 and transducers 531-534).

At block 710, an audio stream can be analyzed. The audio stream may be analyzed to determine one or more suitable characteristics of the stream. For example, the audio stream may be analyzed to determine the audio stream's frequency composition (see, e.g., composition 601 shown in FIG. 6). In accordance with this disclosure, any suitable technique can be used to analyze the audio stream and determine the audio stream's frequency composition. In another example, the audio stream may be analyzed to determine the audio stream's average volume. Like the audio stream received in process 400 (see FIG. 4), the audio stream analyzed at block 710 may be analog or digital. In some embodiments, process 700 may include converting an audio stream from analog to digital or from digital to analog before performing the analysis at block 710.

At block 720, at least one transducer from an array of transducers may be adjusted based on the analysis. The at least one transducer may be adjusted by changing the transducer's resonant frequency. For example, an electrical potential may be applied across an element of the transducer and the transducer's resonant frequency may change based on the potential. In some embodiments, the resonant frequency of one or more transducers may be changed based on a frequency range resulting from the analysis. As previously explained, frequency bands that are prominently featured in an audio stream may correspond to narrower frequency ranges (see, e.g., frequency range groups 602 and 604 shown in FIG. 6), while frequency bands that are less emphasized may correspond to wider frequency ranges (see, e.g., frequency range group 603 shown in FIG. 6). Accordingly, the resonant frequencies of one or more transducers may be adjusted to customize the transducers for the respective frequency ranges and, therefore, optimize the accuracy and efficiency of the audio system around the frequencies that are prominent in the audio stream. In some embodiments, every transducer in the array may be adjusted based on the analysis. For example, every audio transducer in the array may be adjusted based on the analysis so that the array is completely customized for accurately and efficiently producing sound from the audio stream.

At block 730, the audio stream is converted into component signals. Each component signal may correspond to a frequency range (see, e.g., chart 600 shown in FIG. 6). In some embodiments, the adjustments performed at block 720 may affect the component signals created at block 730. For example, the component signals created at block 730 may be based on frequency ranges that correspond to the adjusted array of transducers. In some embodiments, block 720 and block 730 may occur simultaneously. For example, at least one transducer may be adjusted while the audio stream is converted into component signals. In this manner, less buffering may be necessary to perform process 700 in real time.

In some embodiments, the converting performed at block 730 may include analyzing the component signals to ensure that the signals will not mechanically or thermally damage any of the transducers in the array (e.g., analyzing the magnitude of the component signals).

At block 740, each of the component signals are transmitted to a different transducer in the array of transducers. Each component signal may be transmitted to a respective transducer so that the frequency range of the component signal corresponds to (e.g., is approximately centered over) the resonant frequency of the transducer, which may have been adjusted at block 720. After transmission to the array of transducers, the adjusted transducers can then provide the sound accurately and efficiently.

While process 700 describes analyzing an audio stream and making adjustments accordingly, it is understood that the teachings of process 700 can be combined with those of process 400 without deviating from the spirit and scope of the disclosure. For example, in addition to analyzing an audio stream, process 700 may include analyzing an array of transducers (see, e.g., block 410 shown in FIG. 4). Continuing the example, adjusting one or more of the transducers (block 720) and/or converting the audio stream into component signals (block 730) may be based on the analysis of the array, including such features as the number of audio transducers or the unadjusted (i.e., natural) resonant frequencies of the audio transducers. Moreover, process 700 may incorporate the techniques disclosed in connection with process 400 for avoiding transducer damage or compensating in response to faulty or damaged transducers. In some embodiments, a process may only incur a negligible decrease in audio quality based on a faulty or damaged transducer because the undamaged transducers may be dynamically adjusted to cover the frequency range corresponding to the faulty or damaged transducer. For example, block 720 may include adjusting at least one transducer from an array to compensate for any faulty or damaged transducers, block 730 may include converting the audio stream into component signals that only correspond to undamaged transducers and block 740 may include transmitting component signals to only the undamaged transducers.

The same principles underlying the previous descriptions of accurately and efficiently generating sound through an array of transducers can be used to accurately and efficiently detect sound. For example, an array of transducers can be used to detect sound, but each transducer may be subject to a different filter so that each transducer only contributes a narrow range of frequencies centered around the transducer's resonant frequency. This narrow range of frequencies around a transducer's resonant frequency may provide the most accurate measurements possible from each transducer. In accordance with the disclosure, such detection functionality can be provided by an array of transducers that is also capable of generating sound (see, e.g., transducer arrays discussed in connection with FIG. 1-7) or by an array of transducers that is specially designed for detecting sound.

Figure 8:
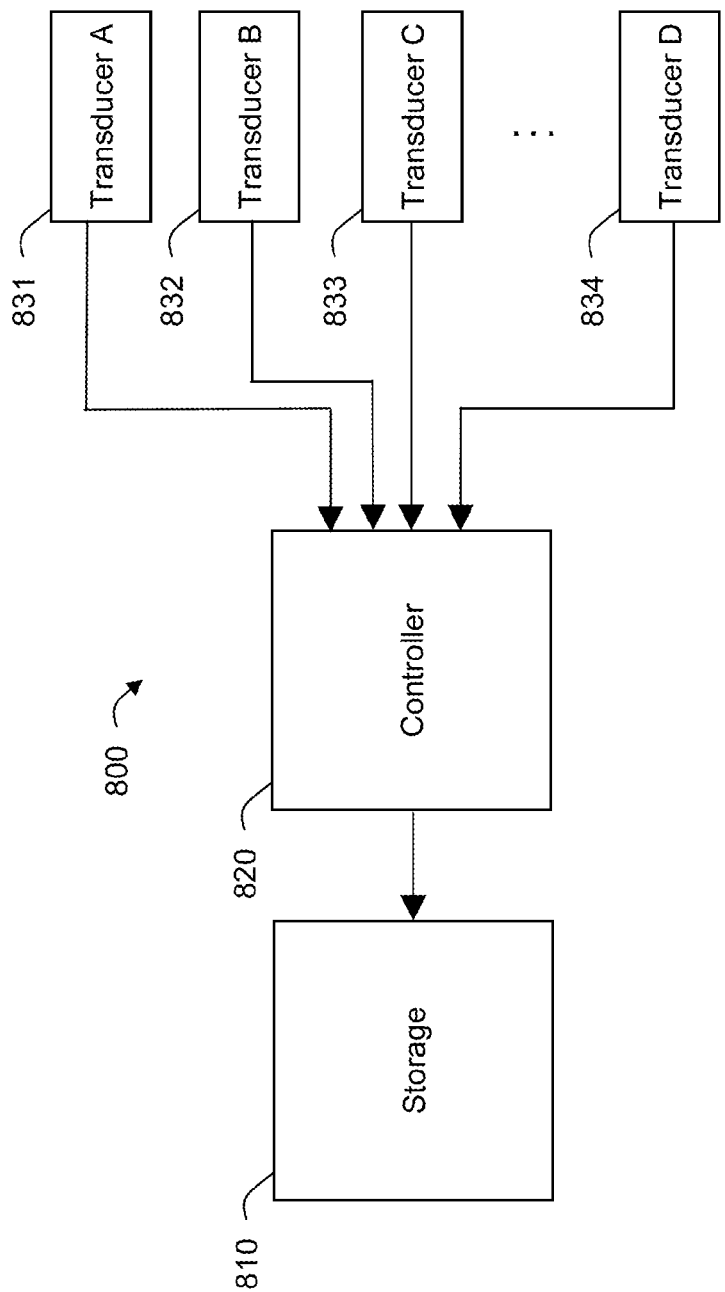
FIG. 8 is a schematic view of an illustrative audio system incorporating an array of transducers in accordance with some embodiments of the invention.

FIG. 8 includes audio system 800 incorporating an array of transducers in accordance with some embodiments. System 800 can include storage 810, controller 820, and transducers 831-834. Storage 810 can be any storage or memory for storing audio signals or data. In some embodiments, storage 810 can store analog audio signals (e.g., on a magnetic tape). In some embodiments, storage 810 can store digital audio data (e.g., on a hard disk drive or flash memory). In some embodiments, storage 810 can store metadata information related to audio signals or data. For example, metadata information may include information related to controller 820 or one or more of transducers 831-834. In some embodiments, such information may be used when recreating a sound from the stored audio signal or data.

Transducers 831-834 can each be any suitable audio transducer for detecting sound. In some embodiments, one or more of transducers 831-834 can be a sound detection device (e.g., a microphone transducer) optimized for a particular frequency. In some embodiments, one or more of transducers 831-834 may include conductive material coupled with or integrated into a diaphragm and, when the diaphragm is moved by audio waves, the current flowing through the conductive material may be altered to generate an electric signal through electromagnetic induction.

In some embodiments, each of transducers 831-834 can also be capable of generating sound. For example, transducers 831-834 may be substantially similar to transducers 131-134 shown in FIG. 1 or transducers 531-534 shown in FIG. 5 and transducers 831-834 may be substituted for those transducers in their respective systems.

In some embodiments, one or more of transducers 831-834 may include a physical filter that controls which sound frequencies reach each transducer. Providing such physical filters can prevent interference or even transducer damage from sounds that are well outside the narrow range of frequencies that a transducer is optimized to receive. For example, each of transducers 831-834 may include a different screen covering the transducer so that each transducer receives a different range of frequencies, and that range may correspond generally to the transducer's resonant frequency. In some embodiments, physical filters provided with transducers 831-834 may allow relatively wide ranges of frequencies to pass so that each of transducers 831-834 can be adjusted to detect a relatively narrow range of frequencies within the physical filter's range. In some embodiments, no physical filters may be provided with transducers 831-834.

Controller 820 may be electrically coupled to both storage 810 and transducers 831-834. In some embodiments, controller 820 may be electrically coupled with storage 810 and/or transducers 831-834 through one or more conductors (e.g., traces, wires or cables). In some embodiments, controller 820 may be coupled with storage 810 and/or one or more of transducers 831-834 through a wireless communications interface. Controller 820 can include any suitable circuitry for processing audio, including one or more processors, one or more digital signal processors, one or more amplifiers, one or more crossovers, one or more filters, any other suitable circuitry, or any suitable combination thereof. Controller 820 can receive audio signals or data from one or more of transducers 831-834 and combine them into a collective signal, data stream or data file.

In some embodiments, controller 820 may dynamically adjust one or more of transducers 831-834. For example, controller 820 may adjust the resonant frequency of one or more of transducers 831-834. In some embodiments, controller 820 may dynamically adjust the resonant frequency of one or more transducers based on previously received audio signals so that the array can be configured to accurately detect future audio signals. For example, if the received audio signals indicate prominent frequency bands, the array of transducers may be configured so that there is a higher resolution in those frequency bands (see, e.g., frequency range groups 602 and 604 shown in FIG. 6). In some embodiments, system 800 may periodically analyze previously received audio signals and configure the array of transducers accordingly so that the transducers are regularly updated as the received audio signals change.

In some embodiments, controller 820 may filter the audio signals or data received from each transducer based on the resonant frequency of each transducer or a range around the resonant frequency of each transducer. For example, controller 820 may apply filters with window functions to each received signal or data, and each window function may be centered around the resonant frequency of the audio transducer from which the signal is received. In other words, each filter may only permit a narrow range of frequencies near the resonant frequency of each transducer and restrict all other frequencies. Once the received signals have been filtered, controller 820 may combine the filtered signals or data to create a collective audio stream. For example, controller 820 may add together each filtered signal or data stream to generate a collective audio stream representing the entire range of sound detected by the array of transducers 831-834.

Controller 820 may transmit the audio stream to storage 810 for storage. In some embodiments, controller 820 may convert an audio stream before transmitting it to storage 810. For example, controller 820 may convert an analog audio signal within the audio stream to digital data if storage 810 is not able to store analog audio signals. In some embodiments, storage 810 may be able to store both analog audio signals and digital data and conversion may be unnecessary.

Figure 9:
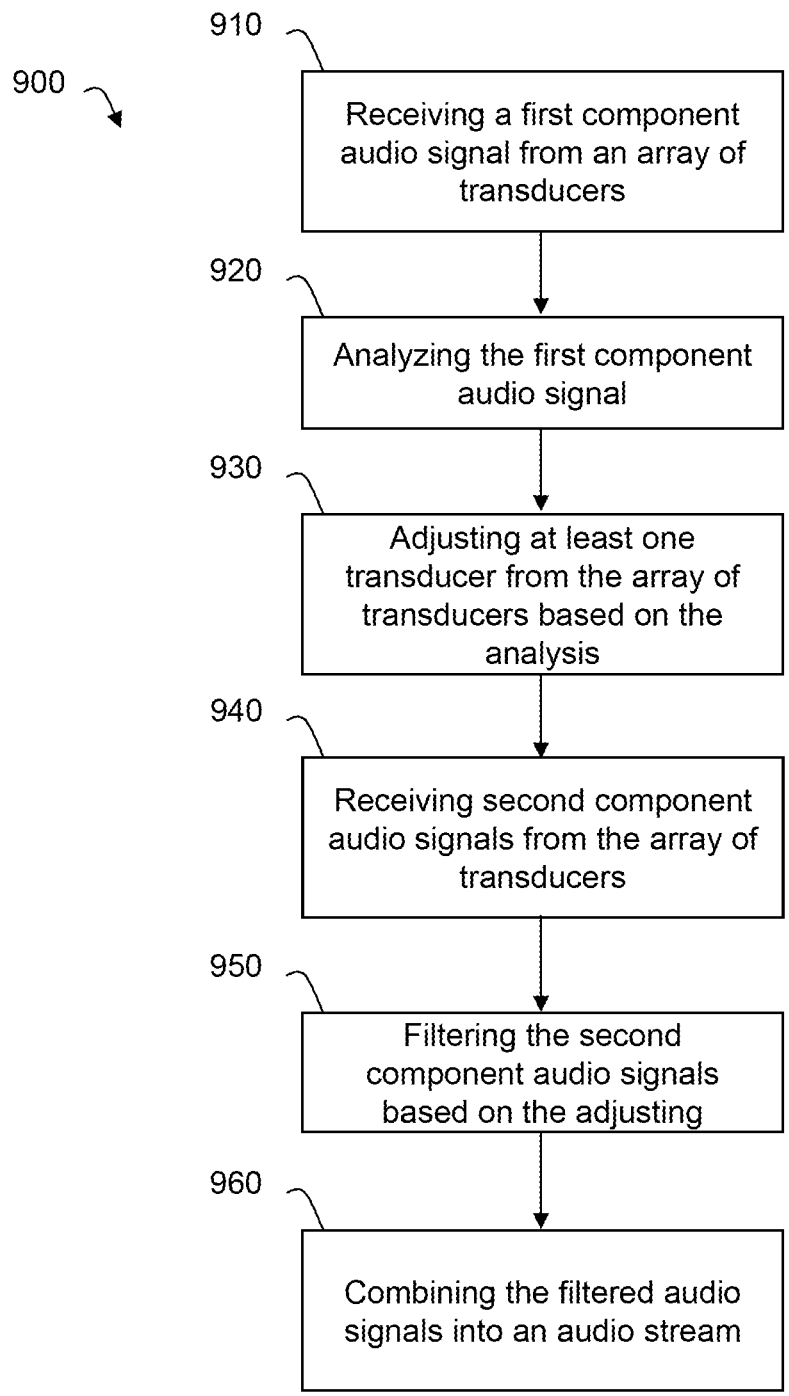
FIG. 9 is a flowchart of an illustrative process for employing an array of audio transducers in accordance with some embodiments of the invention.

FIG. 9 includes process 900 for employing an array of audio transducers in accordance with some embodiments of the invention. For example, process 900 can be used to detect high quality audio with an array of dynamic audio transducers. Process 900 can be performed by an audio system that includes an array of transducers (e.g., system 800 and transducers 831-834). At block 910, a component audio signal can be received from an array of transducers. For example, an array of transducers (see, e.g., transducers 831-834 shown in FIG. 8) can generate at least one component audio signal based on sound and then the signal can be received by a controller (see, e.g., controller 820 shown in FIG. 8). In some embodiments, the array of transducers can generate a plurality of component audio signals at block 910. For example, each transducer in the array can generate a different component audio signal and the component audio signals can then be received by a controller.

At block 920, one or more component audio signals can be analyzed. For example, a controller (see, e.g., controller 820 shown in FIG. 8) can analyze one or more incoming component audio signals to determine the frequency composition of the collective sound (see, e.g., composition 601 shown in FIG. 6). In some embodiments, every component audio signal received at block 910 can be analyzed at block 920. In some embodiments, the one or more component audio signals may be analyzed individually. In some embodiments, the one or more component audio signals may first be combined and then analyzed collectively.

At block 930, at least one transducer from the array may be adjusted based on the analysis. For example, the resonant frequencies of one or more transducers from the array may be adjusted so that the array is optimized to detect the collective sound. In some embodiments, the resonant frequencies of one or more transducers from the array may be adjusted to provide a higher resolution of audio detection (see, e.g., frequency range groups 602 and 604 shown in FIG. 6). Accordingly, the array may be able to more accurately detect the sound in the most important frequencies.

At block 940, additional component audio signals may be received from the array of transducers. For example, each transducer in an array may receive a different incoming component audio signal at block 940. The component audio signals received at block 940 may be considered "second" component audio signals because they are received after a component audio signal received at block 910. The signals received at block 940 may be received after the one or more transducers have been adjusted. In other words, the audio signals received at block 940 may be received through transducers which have been adjusted based on the frequencies that were detected at block 910 (e.g., a relatively short time before block 940). Accordingly, the component audio signals received at block 940 may be more useful for accurately detecting sound.

At block 950, the "second" component audio signals may be filtered based on the adjusting. For example, the signals received at block 940 may be filtered so that each transducer in the array contributes a frequency range tailored to its resonant frequency, which may have been adjusted at block 930. In some embodiments, each component audio signal may be filtered using a window filter that only passes a frequency range centered around the corresponding transducer's resonant frequency. As previously discussed, the resonant frequency of one or more transducers may have been adjusted at block 930. Moreover, the width of the frequency range allowed to pass through the filter may be based on the proximity of neighboring frequency ranges, one or more of which may have also been adjusted at block 930. Accordingly, the component audio signals can be filtered based on the adjusting performed at block 930.

At block 960, the filtered audio signals can be combined into an audio stream. For example, the results of the filtering can be combined into an audio stream that represents the total sound detected by the array. In situations where each transducer contributes only frequencies that are closely related to the transducer's respective resonant frequency, the audio stream may have a higher quality with minimal distortions. In some embodiments, process 900 may further include transmitting the audio stream to a storage unit (see, e.g., storage 810 shown in FIG. 8) for storing.

In some embodiments, a sound detection process (e.g., process 900 shown in FIG. 9) may operate an array of transducers to compensate if one or more of the transducers is faulty or has incurred mechanical or thermal damage. If one or more faulty or damaged transducers are identified, those transducers may be effectively removed from service and the process may no longer use component signals from the faulty or damaged transducers to form the final audio stream. Moreover, unlike a traditional microphone that can be totally impaired if it is damaged, other transducers in the array (and potentially the array as a whole) may still be able to receive high quality audio even if some of the transducers are damaged. For example, block 920 may include determining whether any of the transducers in the array are damaged, block 930 may include adjusting at least one transducer from the array of transducers to compensate for a damaged transducer and block 960 may include only combining filtered audio signals that correspond to undamaged transducers.

In some embodiments, systems may be able to both detect and generate sound accurately and efficiently. For example, system 500 (shown in FIG. 5) may be able to provide the same functionality as system 800 and vice-versa. In some embodiments, a single array of transducers can perform the functions previously described with respect to both transducers 531-534 and transducers 831-834. For example, each transducer in an array may be able to both generate sound based on an electrical signal and generate an electrical signal based on sound. In some embodiments, a single unit of circuitry can perform the functions previously described with respect to both controller 520 and controller 820. For example, controller 520 may be operative to assist in sound detection by combining audio signals or data received from transducers 531-534. As another example, controller 820 may be operative to assist in sound generation by dividing an audio signal or data stream into component signals or data streams and transmitting the component signals or data streams to transducers 831-834. Accordingly, system 500 may be able to perform both process 700 and process 900 and system 800 may be able to perform both process 700 and process 900. In some embodiments, a converter may operate in different modes (e.g., sound generation and sound detection), and the converter may change modes based on a user input or other suitable event. In some embodiments, a single unit of circuitry can perform the functions previously described with respect to both source 510 and storage 810. For example, a single component may function as both a source of audio signals or data streams representing audio signals and a storage location for detected audio signals or data streams representing detected audio signals.

The various embodiments of the invention may be implemented by software, but can also be implemented in hardware or a combination of hardware and software. The invention can also be embodied as computer readable code on a computer readable medium. The computer readable medium can be any data storage device that can store data which can thereafter be read by a computer system. Examples of a computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The above described embodiments of the invention are presented for purposes of illustration and not of limitation. It is understood that one or more features of an embodiment can be combined with one or more features of another embodiment to provide systems and/or methods without deviating from the spirit and scope of the invention.

What is claimed is:

1. A method for generating sound using an array of transducers, the method comprising:
    analyzing an array of transducers to determine:
        a number of transducers in the array; and
        a resonant frequency of each transducer of the number of transducers in the array;
    receiving an audio stream;
    converting the audio stream into a number of component signals, wherein:
        the number of component signals corresponds to the number of transducers in the array; and
        the component signals correspond to the determined resonant frequency of each transducer of the number of transducers in the array; and
    transmitting each of the number of component signals to a respective transducer in the array of transducers.

2. The method of claim 1, wherein analyzing further comprises:
    measuring an electrical characteristic of the array of transducers.

3. The method of claim 1, wherein:
    analyzing further comprises determining a relative location of at least two transducers in the array; and
    converting further comprises converting based at least partially on the determined relative location.

4. The method of claim 1, wherein:
    analyzing further comprises determining a maximum volume output of at least two transducers in the array; and
    converting further comprises converting based at least partially on the determined maximum volume output.

5. The method of claim 1, wherein analyzing further comprises:
    determining that at least one transducer in the array has been damaged.

6. The method of claim 5, wherein converting further comprises not converting the audio stream into component signals that correspond to the at least one damaged transducer in the array, such that the number of component signals corresponds to the number of transducers minus the at least one damaged transducer.

7. The method of claim 5, wherein transmitting comprises not transmitting any component signals to the at least one damaged transducer in the array.

8. The method of claim 1, wherein analyzing further comprises:
    determining whether any transducer in the array has been damaged.

9. The method of claim 8, wherein:
    the number of component signals corresponds to a number of undamaged transducers in the array; and
    the number of undamaged transducers corresponds to the determined number of transducers in the array minus a determined number of damaged transducers.

10. The method of claim 1, further comprising:
    analyzing the number of component signals, prior to the transmitting, to check if any of the number of component signals will damage a corresponding transducer in the array of transducers.

11. The method of claim 1, further comprising:
    receiving an incoming component audio signal from the array;
    analyzing the incoming component audio signal;
    adjusting at least one transducer from the array based on analyzing the incoming component audio signal; and
    receiving a plurality of incoming component audio signals, each of the plurality being received from a different transducer in the array.

12. The method of claim 11, further comprising:
    combining the plurality of incoming component audio signals into an incoming audio stream.

13. The method of claim 11, further comprising:
    filtering the plurality of incoming component audio signals based on the adjusting; and
    combining the filtered audio signals into an incoming audio stream.

14. The method of claim 1, wherein:
    each transducer in the array comprises a physical characteristic; and
    the physical characteristic comprises a diaphragm having a rigidity.

15. A system for generating sound using an array of transducers, the system comprising:

a converter electrically coupled to a source of an audio stream; and an array of transducers each being electrically coupled with the converter, wherein the converter is configured to:

analyze the array of transducers to determine:
a number of transducers in the array;
a first resonant frequency of a first transducer in the array; and
a second resonant frequency of a second transducer in the array;

receive the audio stream from the source;

convert the audio stream into the number of component signals corresponding to the number of transducers in the array, wherein:
a first component signal of the number of component signals corresponds to the determined first resonant frequency of the first transducer; and
a second component signal of the number of component signals corresponds to the determined second resonant frequency of the second transducer in the array; and transmit each of the number of component signals to a respective transducer in the array, such that the first component signal is transmitted to the first transducer and the second component signal is transmitted to the second transducer.

16. The system of claim 15, wherein the converter is further configured to:
analyze the array of transducers by measuring an electrical characteristic of the array of transducers.

17. The system of claim 15, wherein the converter is further configured to:
analyze the array of transducers by determining a relative location of at least two transducers in the array of transducers, wherein the number of component signals is further based at least partially on the relative location.

18. The system of claim 17, wherein the at least two transducers in the array correspond to the first transducer and the second transducer.

19. The system of claim 15, wherein the converter is further configured to:
analyze the array of transducers by determining a maximum volume output of at least two transducers in the array of transducers, wherein the number of component signals is further based at least partially on the maximum volume output.

20. The system of claim 19, wherein the at least two transducers correspond to the first transducer and the second transducer.

21. The system of claim 15, wherein the converter is further configured to:
analyze the array of transducers by determining that at least one transducer in the array has been damaged.

22. The system of claim 21, wherein the converter is further configured to:
convert the audio stream into the number component signals, the number of component signals not comprising the at least one damaged transducer in the array; and
transmit each of the number of component signals by not transmitting any component signals to the at least one damaged transducer in the array.

23. The system of claim 15, wherein the converter is further configured to:
analyze the array of transducers by determining whether any transducers in the array have been damaged.

24. The system of claim 23, wherein the number of component signals corresponds to a number of undamaged transducers in the array.

25. The system of claim 15, wherein the converter is further configured to:
analyze the number of component signals to check if any of the number of component signals will damage a corresponding transducer in the array of transducers.

26. The system of claim 15, wherein the converter is further configured to:
receive an incoming component audio signal from the array;
analyze the incoming component audio signal;
adjust at least one transducer from the array based on the analysis of the incoming component audio signal; and
receive a plurality of incoming component audio signals, each of the plurality being received from a different transducer in the array.

27. The system of claim 26, wherein the converter is further configured to:
combine the plurality of incoming component audio signals into an incoming audio stream.

28. The system of claim 26, wherein the converter is further configured to:
filter the plurality of incoming component audio signals based on the adjustment; and
combine the filtered audio signals into an incoming audio stream.

29. A method for generating sound using an array of transducers, the method comprising:
analyzing an audio stream to determine a frequency composition of the audio stream;
adjusting at least one transducer from an array of transducers based on the determined frequency composition of the audio stream, the adjusting comprising changing a resonant frequency of the at least one transducer;
converting the audio stream into a plurality of component signals; and
transmitting each of the plurality of component signals to a respective transducer in the array of transducers.

30. The method of claim 29, wherein
the frequency composition comprises multiple frequency ranges, adjusting further comprises:
modifying a first resonant frequency of a first transducer from the array based on the determined frequency composition of the audio stream such that the modified first resonant frequency of the first transducer corresponds to a respective one of the frequency ranges.

31. The method of claim 30, wherein:
converting further comprises converting the audio stream into a plurality of component signals such that a first component signal has a frequency range that corresponds to the modified first resonant frequency; and
transmitting further comprises transmitting the first component signal to the first transducer.

32. The method of claim 30, wherein adjusting each transducer from the array comprises modifying a resonant frequency of each transducer in the array.

33. The method of claim 29, wherein adjusting further comprises:
adjusting each transducer from the array based on the determined frequency composition of the audio stream.

34. The method of claim 29, wherein converting comprises converting based at least partially on the determined frequency composition of the audio stream.

35. The method of claim 29, wherein converting further comprises:
analyzing the plurality of component signals, prior to the transmitting, to check if any of the plurality of component signals will damage a corresponding transducer in the array of transducers.

36. The method of claim 29, further comprising:
receiving an incoming component audio signal from the array;
analyzing the incoming component audio signal;
adjusting a resonant frequency of at least one transducer from the array based on the analyzing of the incoming component audio signal; and
receiving a plurality of incoming component audio signals, each of the plurality being received from a different transducer in the array.

37. The method of claim 36, further comprising:
combining the plurality of incoming component audio signals into an incoming audio stream.

38. The method of claim 36, further comprising:
filtering the plurality of incoming component audio signals based on the adjusting; and
combining the filtered audio signals into an incoming audio stream.

39. A system for generating sound using an array of transducers, the system comprising:
a controller electrically coupled to a source of an audio stream; and
an array of transducers, each transducer in the array being electrically coupled with the controller, wherein the controller is configured to:
analyze the audio stream to determine a frequency composition of the audio stream;
adjust at least one transducer from the array based on the determined frequency composition of the audio stream to change a resonant frequency of the at least one transducer;
convert the audio stream into a plurality of component signals; and
transmit each of the plurality of component signals to a different transducer in the array.

40. The system of claim 39, wherein the frequency composition comprises multiple frequency ranges, and wherein the controller is further configured to:
modify a first resonant frequency of a first transducer from the array based on the analysis such that the modified first resonant frequency of the first transducer corresponds to a respective one of the frequency ranges.

41. The system of claim 40, wherein:
a first component signal from the plurality of component signals has a frequency range that corresponds to the modified resonant frequency; and
the controller is further configured to transmit each of the plurality of component signals by transmitting the first component signal to the first transducer.

42. The system of claim 39, wherein the controller is further configured to:
adjust at least one transducer from the array by adjusting each transducer from the array based on the determined frequency composition of the audio stream to modify the resonant frequency of each transducer.

43. The system of claim 39, wherein the controller is further configured to:
convert the audio stream by converting the audio stream into a plurality of component signals based at least partially on the determined frequency composition of the audio stream.

44. The system of claim 39, wherein the controller is further configured to:
analyze the plurality of component signals to check if any of the plurality of component signals will damage a corresponding transducer in the array of transducers.

45. The system of claim 39, wherein the controller is further configured to:
receive an incoming component audio signal from the array;
analyze the incoming component audio signal;
adjust a resonant frequency of at least one transducer from the array based on the analysis of the incoming component audio signal; and
receive a plurality of incoming component audio signals, each of the plurality being received from a different transducer in the array.

46. The system of claim 45, wherein the converter is further configured to:
combine the plurality of incoming component audio signals into an incoming audio stream.

47. The system of claim 45, wherein the converter is further configured to:
filter the plurality of incoming component audio signals based on the adjustment; and
combine the filtered audio signals into an incoming audio stream.

* * * * *